US006556643B2

(12) United States Patent
Merritt

(10) Patent No.: US 6,556,643 B2
(45) Date of Patent: Apr. 29, 2003

(54) MAJORITY FILTER COUNTER CIRCUIT

(75) Inventor: Todd Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/938,646

(22) Filed: Aug. 27, 2001

(65) Prior Publication Data

US 2003/0038662 A1 Feb. 27, 2003

(51) Int. Cl.[7] .................................................. G07C 3/00
(52) U.S. Cl. ................. 377/16; 377/45; 327/3; 327/5; 327/7; 327/12; 327/153; 327/161; 327/241; 327/279; 327/286; 327/292; 327/552
(58) Field of Search .......................... 327/3, 5, 7, 12, 327/153, 161, 241, 279, 286, 292, 552; 377/45, 16

(56) References Cited

U.S. PATENT DOCUMENTS

| | | | |
|---|---|---|---|
| 5,956,379 A | * | 9/1999 | Tarleton ..................... 375/376 |
| 6,069,506 A | | 5/2000 | Miller, Jr. et al. |
| 6,087,868 A | | 7/2000 | Millar |
| 6,137,325 A | | 10/2000 | Miller, Jr. |
| 6,137,334 A | | 10/2000 | Miller, Jr. et al. |

* cited by examiner

Primary Examiner—Margaret R. Wambach
(74) Attorney, Agent, or Firm—Dickstein Shapiro Morin & Oshinsky LLP

(57) ABSTRACT

An improved DDLL containing a majority filter counter circuit is disclosed. The majority filter counter circuit is located between the phase detector and the shift register of the DDLL. The majority filter counter circuit receives shifting commands from the phase detector and filters the shift commands from reaching the shift register until a predetermined number (e.g., 16) have been received from the phase detector before transmitting a shift command (either shift right or shift left) to the shift register. Once the shift register receives the shift command, the shift register directs the delay line to shift by one tap in either a shift right or a shift left direction depending upon the phase relationship between CLKIn and CLKOut. By waiting for e.g., 16 shift commands, the majority filter counter circuit ensures that a premature shift command is not delivered to the shift register in the case of a noise event. That is, the phase difference between CLKIn and CLKOut must be significant enough to have delivered e.g., 16 shift commands of either shift right or shift left in order for the delay line to shift by one tap.

51 Claims, 12 Drawing Sheets

SLOW, SHIFT RIGHT

ADJUSTED

FAST, SHIFT LEFT

| FIG. 10-1 |
| FIG. 10-2 |

MAJORITY FILTER COUNTER CIRCUIT

BACKGROUND OF THE INVENTION

1. Field of the Invention

The present invention relates to integrated memory circuits. More specifically, it relates to an improved digital delay locked loop (DDLL) circuit containing a buffer circuit for delaying the shifting of an output signal of the DDLL.

2. Description of Prior Art

Many high speed electronic systems possess critical timing requirements which dictate the need to generate a periodic clock wave form that possesses a precise time relationship with respect to some reference signal. The improved performance of computing integrated circuits (ICs) and the growing trend to include several computing devices on the same board present a challenge with respect to synchronizing the time frames of all the components.

While the operation of all components in the system should be highly synchronized, i.e., the maximum skew or difference in time between the significant edges of the internally generated clocks of all the components should be minute, it is not enough to feed the reference clock of the system to all the components. This is because different chips may have different manufacturing parameters which, when taken together with additional factors such as ambient temperature, voltage, and processing variations, may lead to large differences in the phases of the respective chip generated clocks.

Conventionally, synchronization is achieved by using DDLL circuits to detect the phase difference between clock signals of the same frequency and produce a digital signal related to the phase difference. By feeding back the phase difference-related signal to control a delay line, the timing of one clock signal is advanced or delayed until its rising edge is coincident, or within an acceptable range of coincidence, with the rising edge of a second clock signal.

The operation of conventional DDLLs is shown in FIGS. 1 and 2. In FIG. 1, clock input buffer 104, delay lines 101, 102, and data output buffer 109 constitute an internal clock path. Delay line 101 is a variable delay generator with a logic-gate chain. A second delay line 102 is connected to replica circuits 108, which emulate the internal clock path components. Replica circuits 108 include dummy output buffer 110, with dummy load capacitance 111 and dummy clock buffer 107. The dummy components and second delay line 102 constitute a dummy clock path having close to the same delay time as the internal clock path. Shift register 103 is used for activating a number of delay elements in both delay lines based on a command generated by phase detector 106.

Phase detector 106 compares the dummy clock and the external clock phases which differ by at least one cycle. This comparison is illustrated in FIGS. 2(a), 2(b), 2(c), and 2(d). External clock signal 200 is divided down in divider 105 to produce divided-down external signal 201. Signal 202 is the signal at the output of dummy delay line 102. Signal 203, which is generated inside phase comparator 106, is a one delay unit delayed output dummy line signal 202. If both signals 202 and 203 go high before 201 goes low, this means that the output clock is too fast and phase comparator 106 outputs a shift left (SL) command to shift register 103, as illustrated in FIG. 2(b). Shift register 103 shifts the tap point of delay lines 102 and 101 by one step to the left, increasing the delay. Conversely, if both signals 202 and 203 go high after 201 goes low, this means that the output clock is too slow and phase detector 106 outputs a shift right (SR) command to shift register 103, as illustrated in FIG. 2(d). Shift register 103 shifts the tap point of delay lines 102 and 101 by one step to the right, decreasing the delay. If 201 goes low between the time 202 and 203 go high, the internal cycle time is properly adjusted and no shift command is generated, as illustrated in FIG. 2(c). The output of the internal clock path in this case coincides with the rising edge of the external clock and is independent of external factors such as ambient temperature and processing parameters.

One of the problems associated with the present DLL circuits is that phase detectors (such as 106) are susceptible to noise. This is particularly true in a memory circuit, such as a dynamic random access memory circuit, where many signal switching operations occur. For example, when a bank of memory is activated (e.g., for a memory read or write operation), it pulls down bus voltage which effects the operation of the phase detector 106. In addition, other types of noise events can effect the phase detector 106. The phase detector 106 detects a problem with the phase relationship between the delay line output DLOut and the delay line input DLIn in that the phase relationship is no longer a predetermined value. As a result, the phase detector 106 attempts to correct the perceived problem by sending either an SR or an SL command to the shift register 103 which, in turn, sends a corresponding SR or SL command to delay lines 102 and 101 so as to maintain the predetermined phase relationship.

The problem is that by the time the phase detector 106 has corrected the perceived problem by sending an SR or an SL command, the noise condition has ceased and no correction is needed. Therefore, by attempting to correct a perceived problem, the phase detector 106 overcompensates with an SR or SL and actually takes the two signals out of their predetermined phase relationship.

One solution that has been suggested is to add an N-bit shift register between the phase detector and the delay line when the register is initialized to the center. The shift left and shift right signals received from the phase detector cause the majority filter to shift left or right. If the phase detector detects the predetermined phase relationship, the majority filter shifts toward the center. If the majority filter reaches either the right or the left-most register, the delay line is shifted in the appropriate direction and the majority filter is reset to center. A problem with the proposed solution outlined above is that it can be implemented as a 16 bit filter which requires at least 32 flip-flop circuits which take up a great deal of die space.

What is needed is an improved DDLL circuit that can distinguish when an error detected in the phase relationship between DLOut and DLIn is due to a noise event or due to something more serious that requires an actual shifting of the output signal DLOut. Furthermore, the DDLL circuit would desirably take up very little die space in accomplishing the above.

SUMMARY OF THE INVENTION

The present invention overcomes the problems associated with the prior art by providing an improved DDLL containing a majority filter counter circuit that takes up comparatively little die space. The majority filter counter circuit is located between the phase detector and the shift register of the DDLL. The majority filter counter circuit receives shifting commands from the phase detector and filters the shift commands from reaching the shift register until a predetermined number (e.g., 16) have been received from the phase detector before transmitting a shift command (e.g., shift right (SR), shift left (SL), etc.) to the shift register. Once the shift register receives the shift command, the shift register directs the delay line to shift by one tap in either a right-shift or a left-shift direction depending upon the phase relationship between DLIn and DLOut. By waiting for 16 shift commands in the same direction, the majority filter counter circuit ensures that a premature shift command is not delivered to the shift register in the case of a noise event. That is, the phase difference between DLIn and DLOut must be significant enough to have delivered 16 shift commands of either shift right (SR) or shift left (SL) in order for the delay line to be shifted. Furthermore, the above is achieved with only four flip-flop circuits configured as a 4-bit counter.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described as set forth in exemplary embodiments described below in connection with FIGS. 3–11. Other embodiments may be realized and other changes may be made to the disclosed embodiments without departing from the spirit or scope of the present invention.

Figure 1:
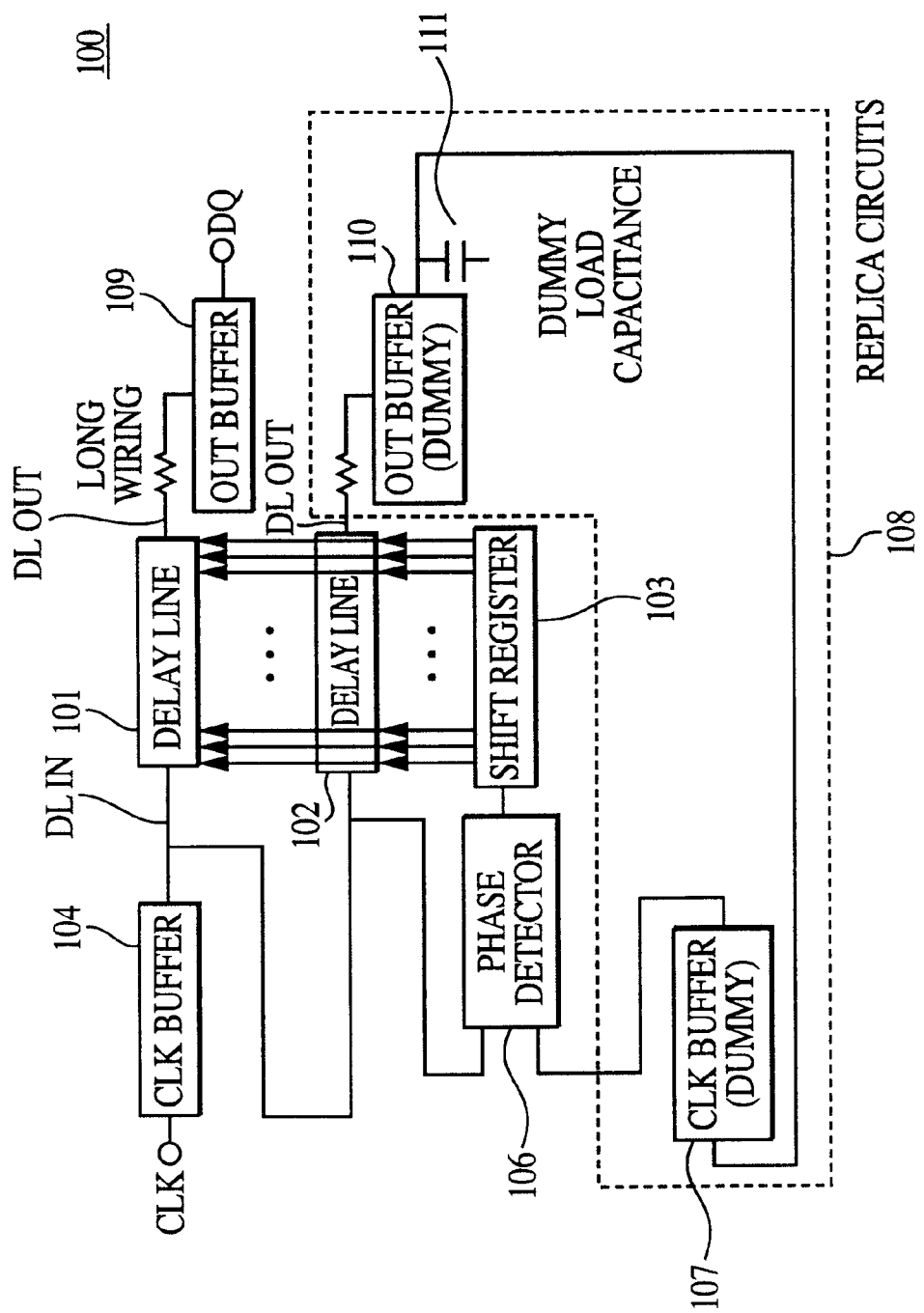
FIG. 1 depicts a conventional digital delay locked loop (DDLL) circuit.
Figure 2A:
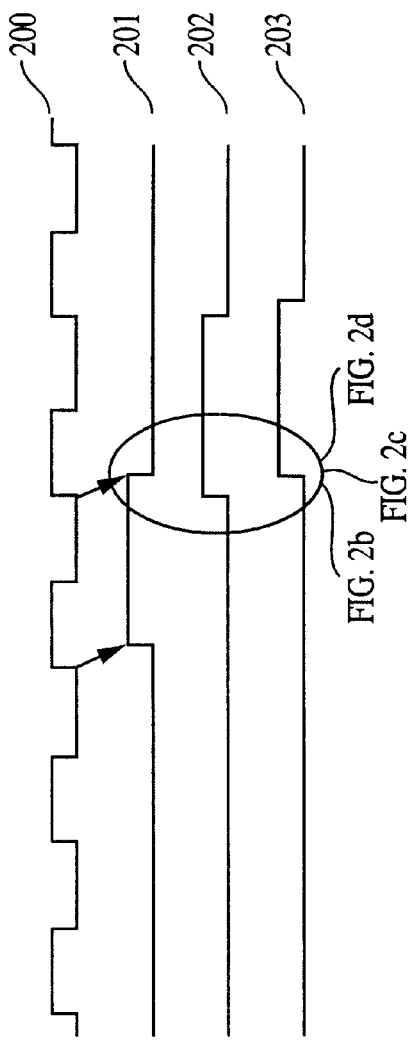
FIGS. 2(a)–2(d) depict various waveforms measured within the FIG. 1 DDLL.
Figure 2D:
Figure 2C:
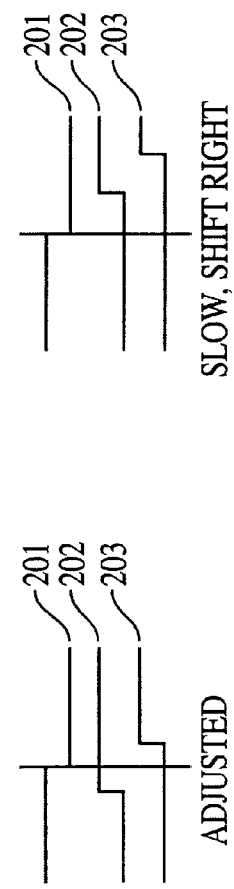
Figure 2B:
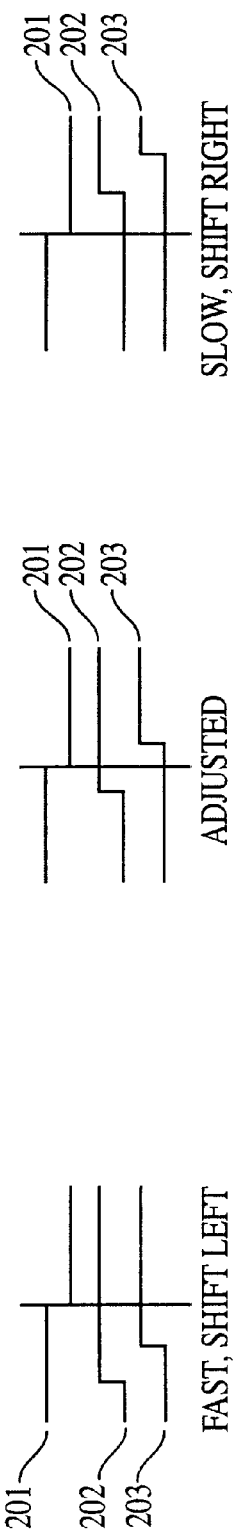
Figure 3:
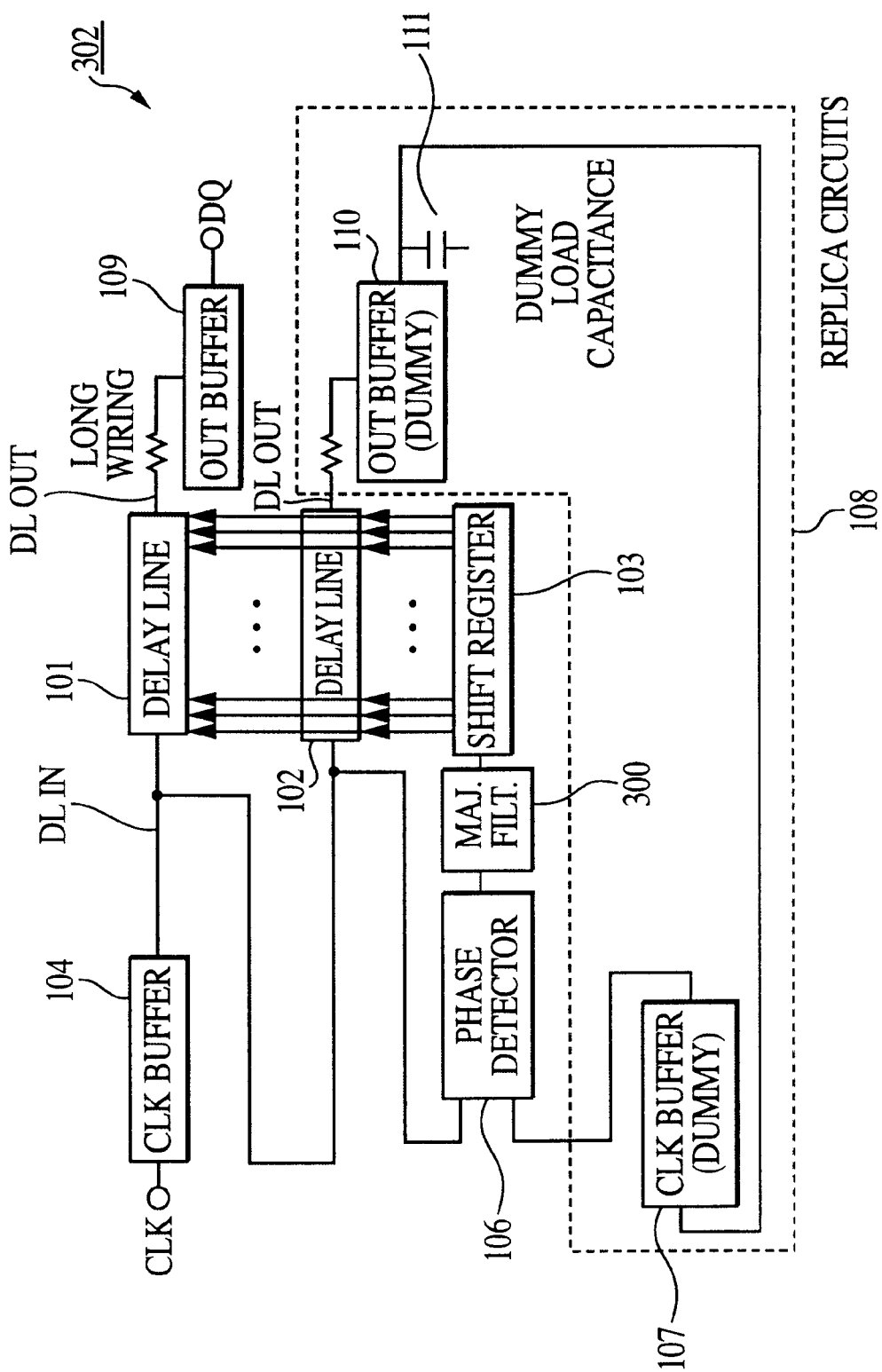
FIG. 3 depicts a DDLL containing a majority filter counter circuit, in accordance with an exemplary embodiment of the invention.

FIG. 3 depicts a digital delay locked loop (DDLL) circuit 302 containing a majority filter counter circuit 300 in accordance with an exemplary embodiment of the invention.

Figures 1, 10:
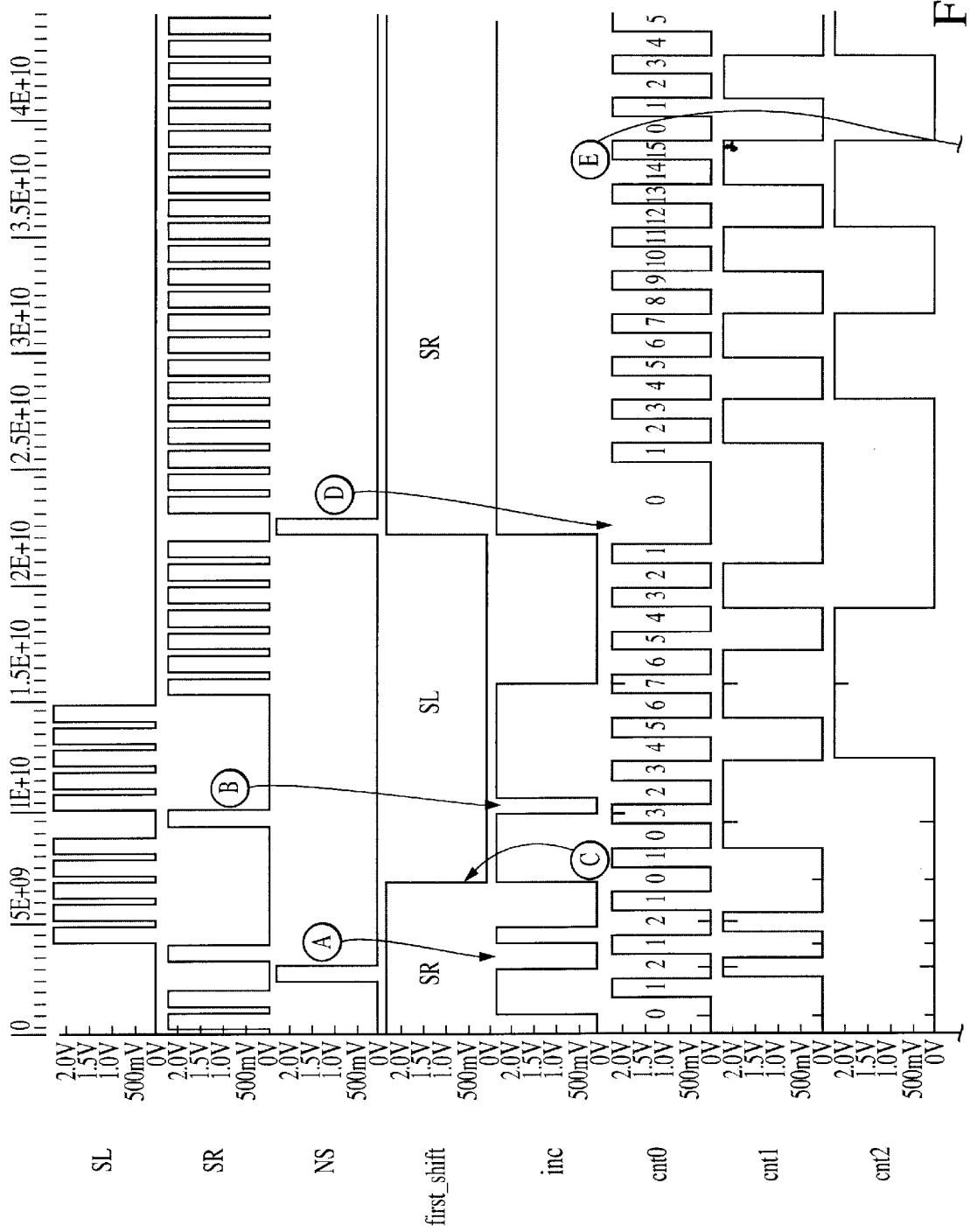
FIG. 10 depicts a timing diagram of the operation of the majority filter counter circuit, in accordance with an exemplary embodiment of the invention.
Figures 2, 10:
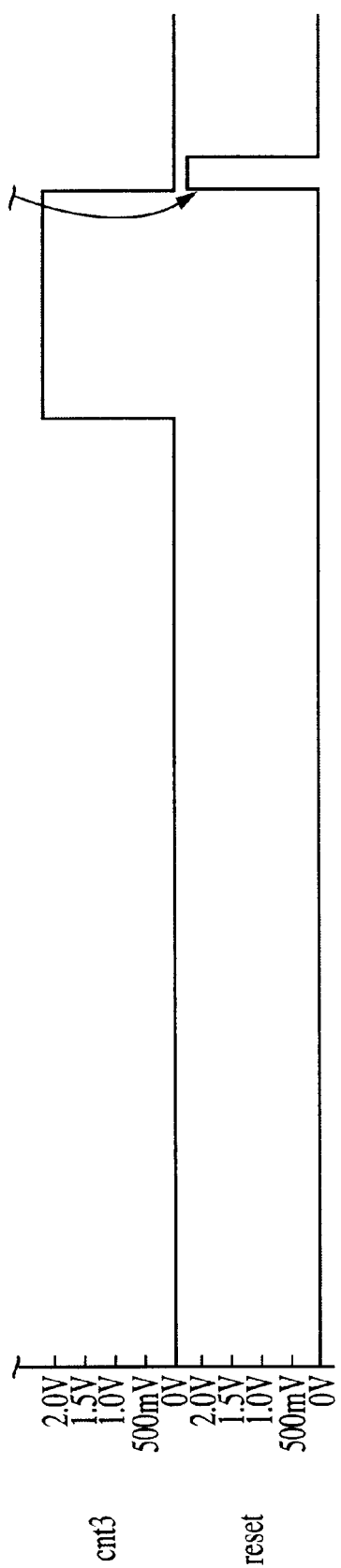

FIG. 3 is identical to FIG. 2 except that the majority filter counter circuit 300 is located between the phase detector 106 and the shift register 103 such that an output of the phase detector 106 is an input to the majority filter counter circuit 300 and an output of the majority filter counter circuit 300 is an input of the shift register 103. As will be described in greater detail below, the majority filter counter circuit 300 acts as a buffer circuit for delaying the shifting of the output signal DLOut of the DDLL 302 until the counter reaches a predetermined value, thus ensuring that the DDLL does not shift the output unless there is a significant phase difference for a substantial period of time (i.e., a period of time that would indicate a problem more serious than a noise event).

Figure 4:
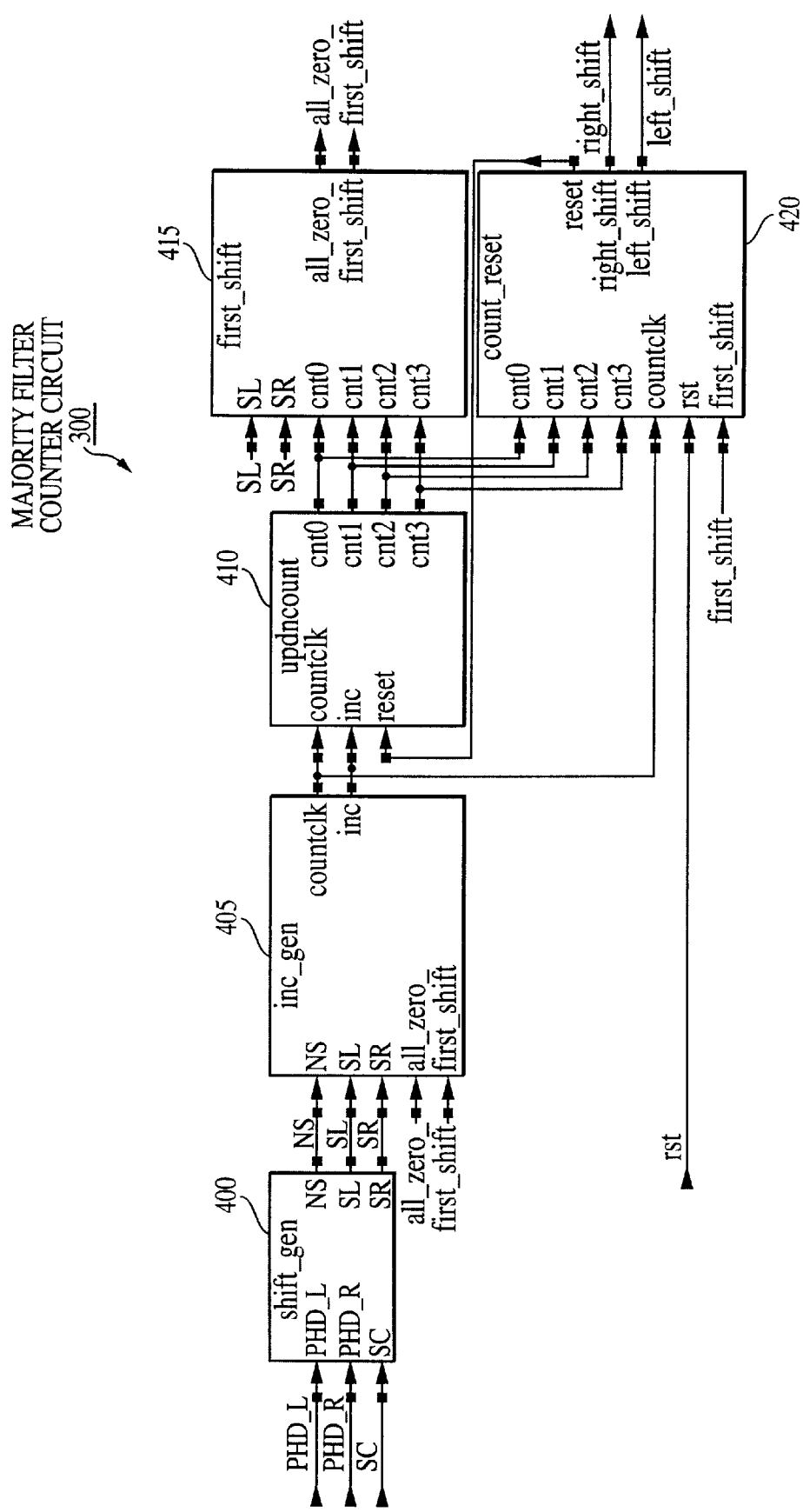
FIG. 4 depicts a block diagram of the majority filter counter circuit of FIG. 3, in accordance with an exemplary embodiment of the invention.

Turning now to FIG. 4, a block diagram of the majority filter counter circuit 300 is depicted. On the left-most side of FIG. 4 is a shift signal generator ("shift_gen") circuit 400. Inputs to the "shift_gen" circuit 400 include a system clock signal (SC), outputs of the phase detector 106 (PHD_L and PHD_R) (i.e., phase detector shift-left command and phase detector shift-right command). The "shift_gen" circuit 400 generates a shift-right (SR), a shift-left (SL) or a no shift (NS) signal based on the inputs SC and the outputs of the phase detector 106 (PHD_R and PHD_L).

To the right of the "shift_gen" circuit 400 is an increment signal generator ("inc_gen") circuit 405 which receives input from the "shift_gen" circuit 400, a first_shift signal and an all zero signal. The "inc_gen" circuit 405 generates the inputs for an up/down counter (updncount). For example, if inc is logic LOW at the output of the "inc_gen" circuit 405, the "inc_gen" circuit 405 commands the counter of the "updncount" circuit 410 to decrement.

The "updncount" circuit 410 contains the counter of the majority filter counter circuit 300. The operation of the "updncount" circuit 410 will be described in greater detail below in connection with FIG. 10.

To the right of the "updncount" circuit 410 is a first shift recorder ("first_shift") circuit 415. The "first_shift" circuit 415 records the first shift command received from the "shift_gen" circuit 400 (i.e., SL or SR). If the first signal received by the "first_shift" circuit 415 is logic HIGH, the "first_shift" circuit 415 is configured to equate that with a shift right (SR); if the first signal received by the "first_shift" circuit 415 is logic LOW, the "first_shift" circuit 415 interprets that as a shift left (SL). Of course, the "first-shift" circuit can be configured for the opposite interpretation of the signals as well. The first signal received by the "first_shift" circuit 415 remains the increment command for an entire counting cycle (i.e., 0000 through 1111). That is, the recorded value (i.e., the first shift command received by the "first_shift" circuit 415) becomes the increment shifter for the counter 410 until either 0000 or 1111 is reached, after which time a new first shift signal is recorded.

For example, if an SR signal is first received by the "first_shift" circuit 415, then all subsequent SR signals received from the "shift_gen" circuit 400 instruct the counter to increment by one. Conversely, all SL signals received by the "first_shift" circuit 415 instruct the counter to decrement by one. In addition, a no shift (NS) signal has the same effect as a decrement signal received by the "first_shift" circuit 415. If, however, the first signal received by the "first_shift" circuit 415 is an SL signal, then all subsequent SL signals received by the "first_shift" circuit 415 result in the counter circuit 410 incrementing by one and the counter circuit decrements by one for each SR signal received after the initial SL signal. Similarly, as before, an NS signal instructs the counter to decrement by one.

Below the "first_shift" circuit 415 is a counter resetter ("count_reset") circuit 420. The "count_reset" circuit 420 resets the counter back to 0000 when the counter counts all the way up to binary 1111 (i.e., binary 15). In addition, when the counter is reset to 0000, a shift pulse is sent to the shift register 103 in the DDLL circuit 302. The "count_reset" circuit 420 sends either a right_shift or a left_shift pulse to the shift register 103 depending upon the value stored by the first_shift circuit 415. That is, if the first signal received by the "first_shift" circuit 415 was an SR signal, then, when the counter reaches 1111, or binary 15, a right_shift command is transmitted from the majority filter counter circuit 300 to the shift register 103 (FIG. 3).

Figure 5:
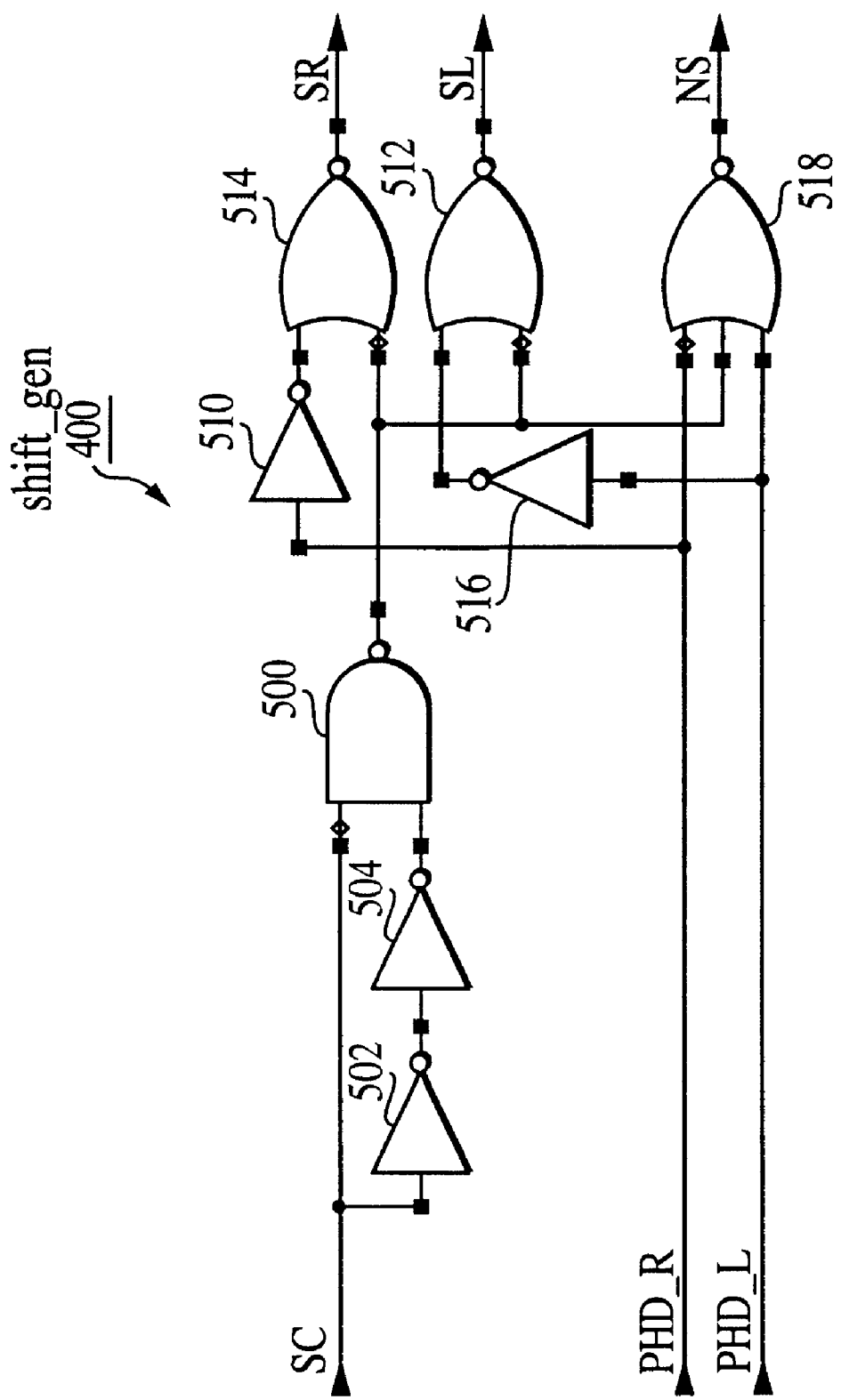
FIG. 5 depicts a schematic diagram of the "shift_gen" circuit of FIG. 4, in accordance with an exemplary embodiment of the invention.

Turning to FIG. 5, a schematic diagram of the shift signal generator ("shift_gen") circuit 400 is depicted. A system clock signal SC is input to inverter 502 and NAND gate 500. The output of inverter 502 is input to inverter 504; the output of inverter 504 is input to NAND gate 500. The output of NAND gate 500 is fed into an input of NOR gate 514. A phase detector right pulse signal (PHD_R) is delivered to an input of inverter 510; the output of inverter 510 is input to NOR gate 514. A phase detector left pulse signal (PHD_L) is delivered to an input of inverter 516. The output of inverter 516 is fed into an input of NOR gate 512. Another input to NOR gate 512 is received from the output of NAND gate 500. PHD_L is also fed into an input of NOR gate 518. An output of NAND gate 500 is also fed into an input of NOR gate 518. A third input of NOR gate 518 receives the PHD_R signal. The "shift_gen" circuit 400 produces an SR output, an SL output and an NS output depending upon the inputs to the "shift_gen" circuit 400 received from the phase detector 106.

Figure 6:
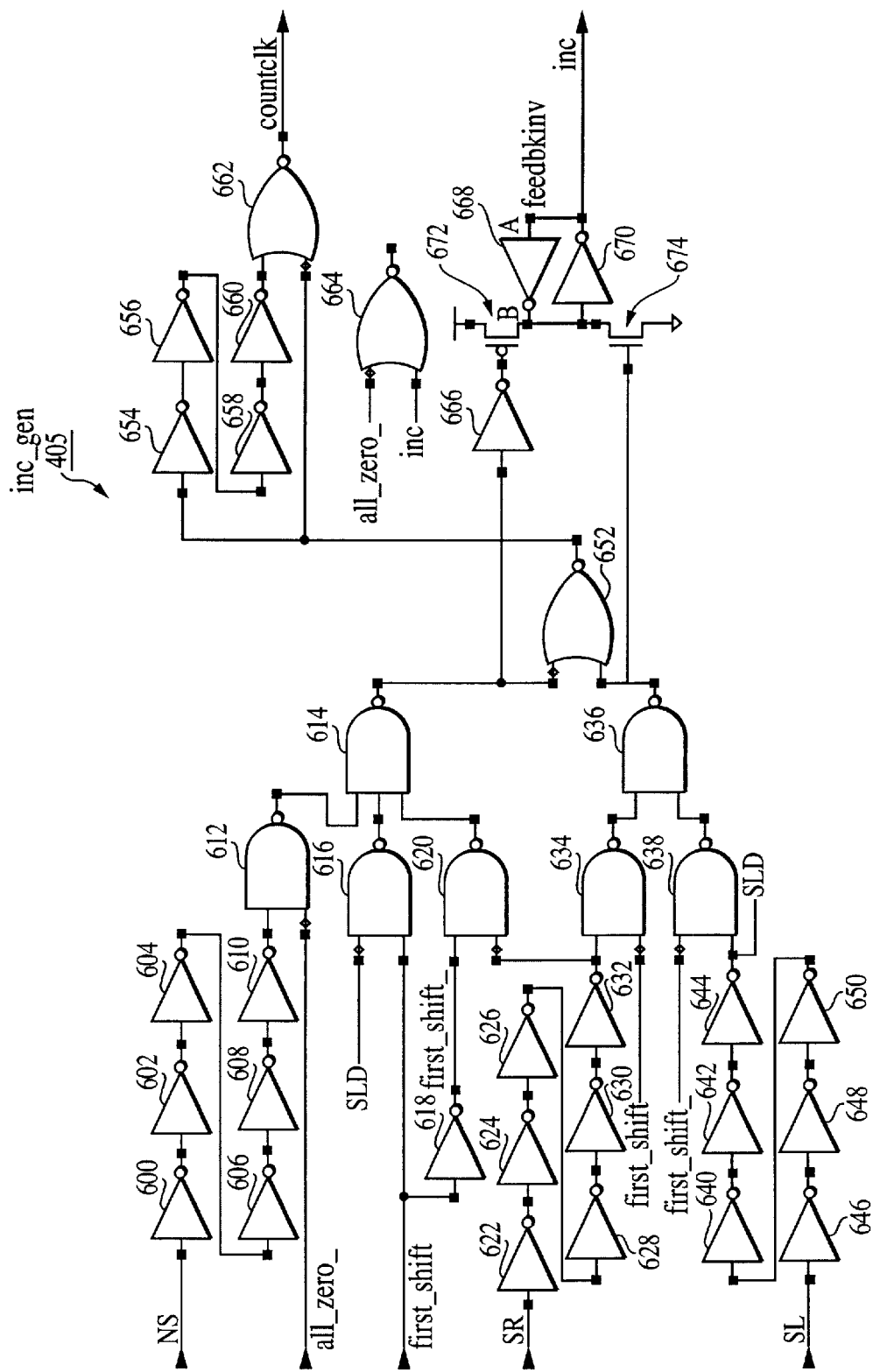
FIG. 6 depicts a schematic diagram of the "inc_gen" circuit of FIG. 4, in accordance with an exemplary embodiment of the invention.

Turning now to FIG. 6, a schematic diagram of the increment signal generator ("inc_gen") circuit 405 is depicted. The NS signal is received by an input to inverter 600. The output of inverter 600 is received by an input of inverter 602; the output of inverter 602 is received by the input of inverter 604; and the output of inverter 604 is received by the input of inverter 606. The output of inverter 606 is received by the input of inverter 608 and the output of inverter 608 is received by the input of inverter 610. The output of inverter 610 is received by the input to NAND gate 612. Another input to NAND gate 612 is an all_zero signal received from the "first_shift" circuit 415. The shift left delay (SLD), resulting from the six inverters 646, 648, 650, 640, 642 and 644, is input to NAND gate 616. This is to match the shift right delay effectively introduced into the input of NAND gate 620, due to the six inverters 622, 624, 626, 628, 630 and 632. A first_shift signal, received from the "first_shift" circuit 415, is input to NAND gate 616. The first_shift signal is also input to inverter 618. The output of NAND gate 612 is fed into an input of NAND gate 614. The output of NAND gate 616 is fed into an input of NAND gate 614, and an output of NAND gate 620 is fed into an input of NAND gate 614. An output of inverter 618 is fed into an input of NAND gate 620. A shift right SR signal is fed into inverter 622. The output of inverter 622 is fed into an input of inverter 624. The output of inverter 624 is fed into an input of inverter 626. The output of inverter 626 is fed into the input of inverter 628. The output of inverter 628 is fed into an input of inverter 630. The output of inverter 630 is fed into an input of inverter 632 and an output of inverter 632 is fed into an input of NAND gate 620 and also fed into an input of NAND gate 634.

The first_shift signal, received from the "first_shift" circuit 415 is also fed into an input of NAND gate 634. The output of NAND gate 634 is fed into an input of NAND gate 636. The inverse first_shift signal is fed into an input of NAND gate 638. A shift left SL is fed into an input of inverter 646. The output of inverter 646 is fed into an input of inverter 648 and the output of inverter 648 is fed into an input of inverter 650. The output of inverter 650 is fed into the input of inverter 640 and the output of inverter 640 is fed into the input of inverter 642. The output of inverter 642 is fed into the input of inverter 644 and the output of inverter 644 is fed into an input of NAND gate 638. The output of inverter 644 is effectively the SL signal with a time delay (i.e., SLD)

Still referring to FIG. 6, outputs of NAND gates 634 and 638 are fed into NAND gate 636. Outputs of NAND gates 636 and 614 are fed into inputs of NOR gate 652. In addition, the output of NAND gate 614 is fed into an input of inverter 666. The output of NAND gate 636 is also fed into a gate of MOSFET 674. The output of inverter 666 is fed into a gate of MOSFET 672. A first terminal of MOSFET 672 is coupled to a first terminal of MOSFET 674 and a second terminal of MOSFET 674 is connected to ground. The point where MOSFET 672 and 674 are joined is coupled to the input of inverter 670 and the output of inverter 670 is fed into an input of feedback inverter 668. The output of feedback inverter 668 is coupled to the point where MOSFETs 672 and 674 are coupled. In addition, the output of inverter 670 is an increment control signal (inc) for controlling the incrementation of the counter. The combination of inverter 670 and feedback inverter 668 form a latch for latching the output of NAND gate 614.

The output of NOR gate 652 is fed into and input to inverter 654 and the output of inverter 654 is fed into an input of inverter 656. The output of inverter 656 is fed into an input of inverter 658 and the output of inverter 658 is fed into an input of inverter 660. The output of inverter 660 is fed into an input of NOR gate 662. The other input to NOR gate 662 comes from the output of NOR gate 652. The output of NOR gate 662 is the clock signal cntclk that is fed into each of the four flip-flop circuits of the counter circuit countclk to be described in connection with FIG. 7.

Figure 7:
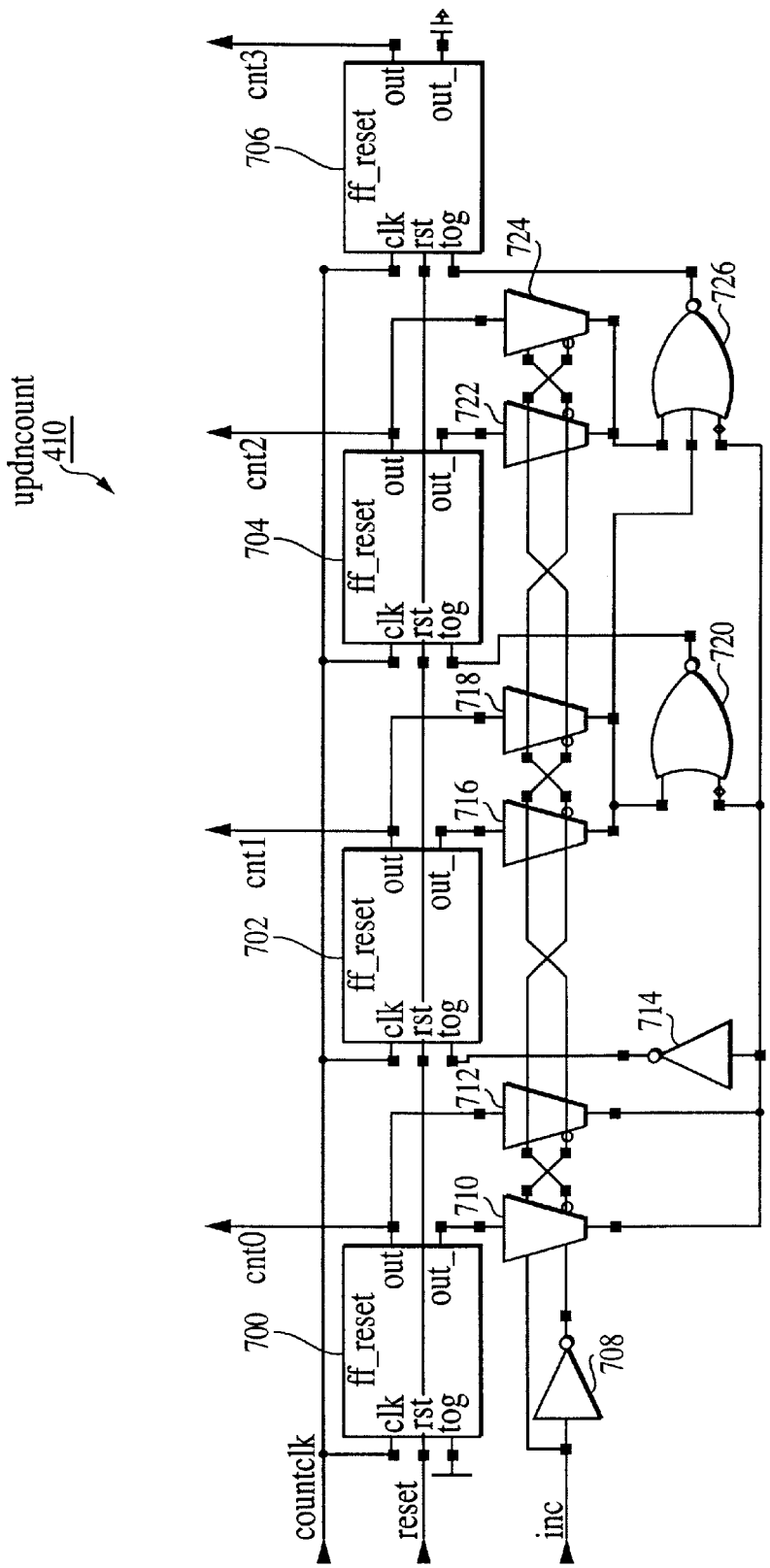
FIG. 7 depicts a schematic diagram of the "updncount" circuit of FIG. 4, in accordance with an exemplary embodiment of the invention.

Turning now to FIG. 7, the counter circuit ("updncount") 410 is depicted in greater detail. The countclock signal generated in FIG. 6 is fed into each of four flip-flops 700, 702, 704, 706. The four flip-flops 700–706 make up the four-bit counter circuit which counts from binary 0000–binary 1111. Another input to each flip-flop circuit 700–706 is a reset signal generated by the "count_reset" circuit 420 (to be described in greater detail below in connection with FIG. 9).

The increment control signal, inc, is input to an inverter 708. The output of inverter 708, as well as the increment control signal itself, is fed into a series of enable terminals of multiplexers 710, 712, 716, 718, 722, 724, as depicted in FIG. 7. Outputs of flip-flops 700–704 are fed into multiplexers 710–724 as depicted in FIG. 7. The output of multiplexers 710 and 712 are fed into an input of inverter 714, and also fed into an input of NOR gate 720, and also fed into an input of NOR gate 726. Outputs of multiplexer 716 and 718 are fed into an input of NOR gate 720 and also fed into an input of NOR gate 726. Outputs of multiplexers 722 and 724 are fed into an input of NOR gate 726. The output of inverter 714 is coupled to a toggle input, tog, of flip-flop circuit 702. The output of NOR gate 720 is coupled to a toggle input of flip-flop circuit 704, and the output of NOR gate 726 is coupled to a toggle input of flip-flop circuit 706. The counter circuit, "updncount," 410 is initialized at binary 0000 and increments when the inc signal is logic HIGH. When the counter is initialized at 0000, the first shift signal received is the increment signal and the opposite signal, or an NS, is a decrement signal. If the counter is at 0000 and then receives a signal to increment, the counter will count to 0001, and so on. If, however, the counter has incremented and has again decremented back down to 0000 and receives a signal to decrement, the counter will treat that as if no signal has been received and skips a clock pulse and waits for the next increment signal, as will be described in connection with the timing diagram of FIG. 10.

Figure 8:
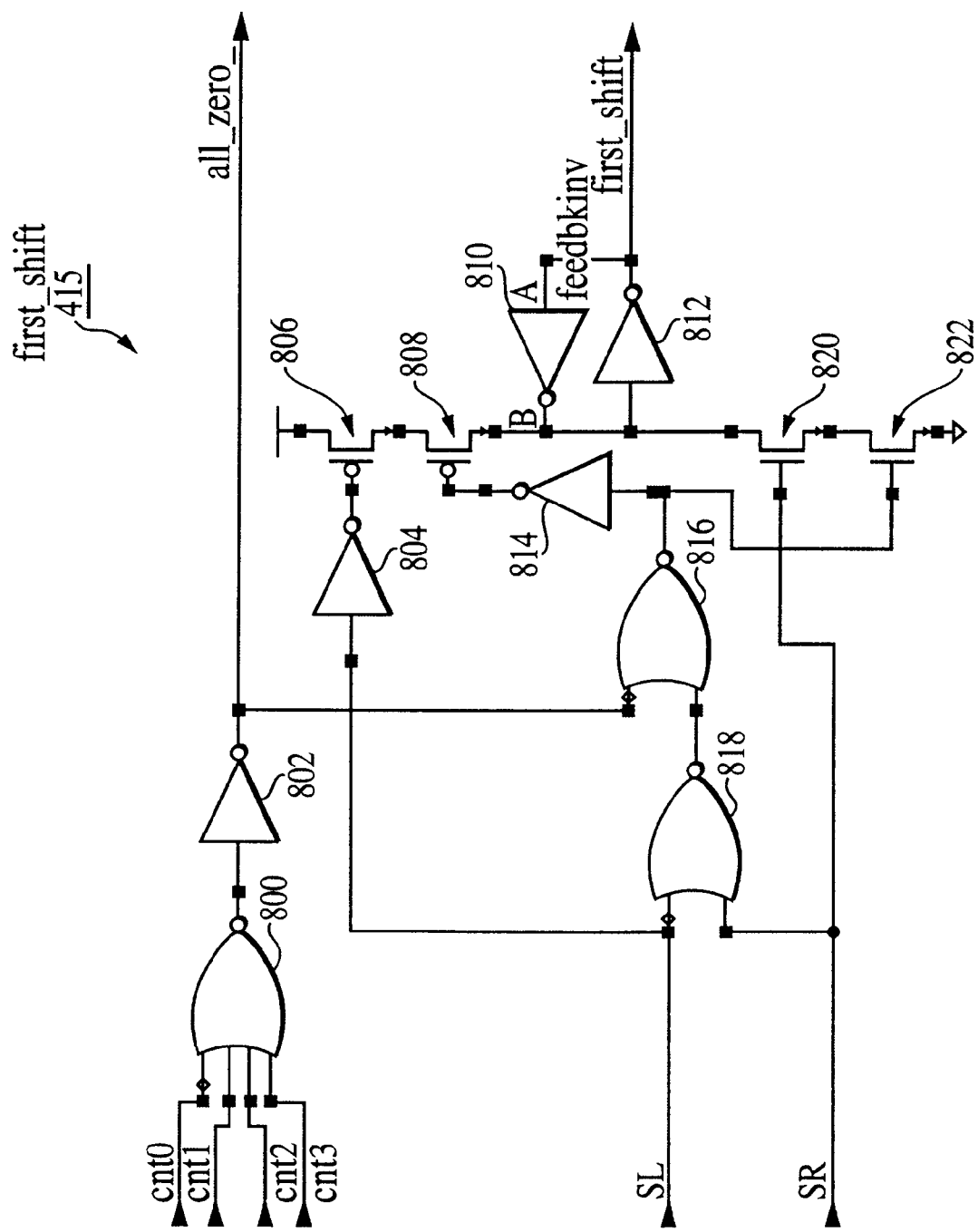
FIG. 8 depicts a schematic diagram of the "first_shift" circuit of FIG. 4, in accordance with an exemplary embodiment of the invention.

Turning now to FIG. 8, a schematic diagram of the "first_shift" circuit 415 is depicted. The outputs of the counter circuit 410, cnt 0, cnt 1, cnt 2 and cnt3, are fed into inputs of NOR gate 800. The output of NOR gate 800 is fed into inverter 802 and the output of inverter 802 becomes the all_zero signal. In addition, the output of inverter 802 is fed into an input of NOR gate 816. A shift left SL signal is input to NOR gate 818 as is a shift right SR signal. In addition, the SL signal is fed into an input of inverter 804 and the SR signal is fed into a gate of MOSFET 820. The output of inverter 804 is fed into a gate of MOSFET 806. The output of NOR gate 818 is fed into a second input of NOR gate 816. The output of NOR gate 816 is fed into an input of inverter 814. The output of inverter 814 is fed into a gate of MOSFET 808. A first terminal of MOSFET 806 is coupled to a first terminal of MOSFET 808. Similarly, a first terminal of MOSFET 820 is coupled to a first terminal of MOSFET 822. The other terminal of MOSFET 822 is coupled to ground. A second terminal of MOSFET 820 is coupled to a second terminal of MOSFET 808 and also coupled to an input of inverter 812. The output of inverter 812 is coupled to an input of feedback inverter 810 and also becomes the first_shift signal. The output of feedback inverter 810 is coupled to the point where MOSFETs 808 and 820 meet.

For example, when the counter decrements, or is reset, to 0000, the "first_shift" circuit 415 determines whether the first shift received by the majority filter counter circuit 300 is a SR or a SL. Whichever shift is received is the increment signal until the counter is reset or decrements back to 0000 (at which time a new first_shift signal is recorded). If the SR line goes logic HIGH, then the SL line is logic LOW. The output of NOR gate 818 is HIGH and the output of NOR gate 816 is also HIGH. Both MOSFETS 820 and 822 are active and the input to inverter 812 is grounded. The output of inverter 812 (i.e., the first_shift signal) goes logic HIGH and remains logic HIGH, via the latch created by inverters 812, 810 and MOSFETS 820, 822, 808 and 806, until the counter again reaches 0000. The logic HIGH signal for first_shift signifies that the first_shift signal is SR. Of course, the circuit can be reconfigured to signify an SL when first_shift goes logic HIGH.

Figure 9:
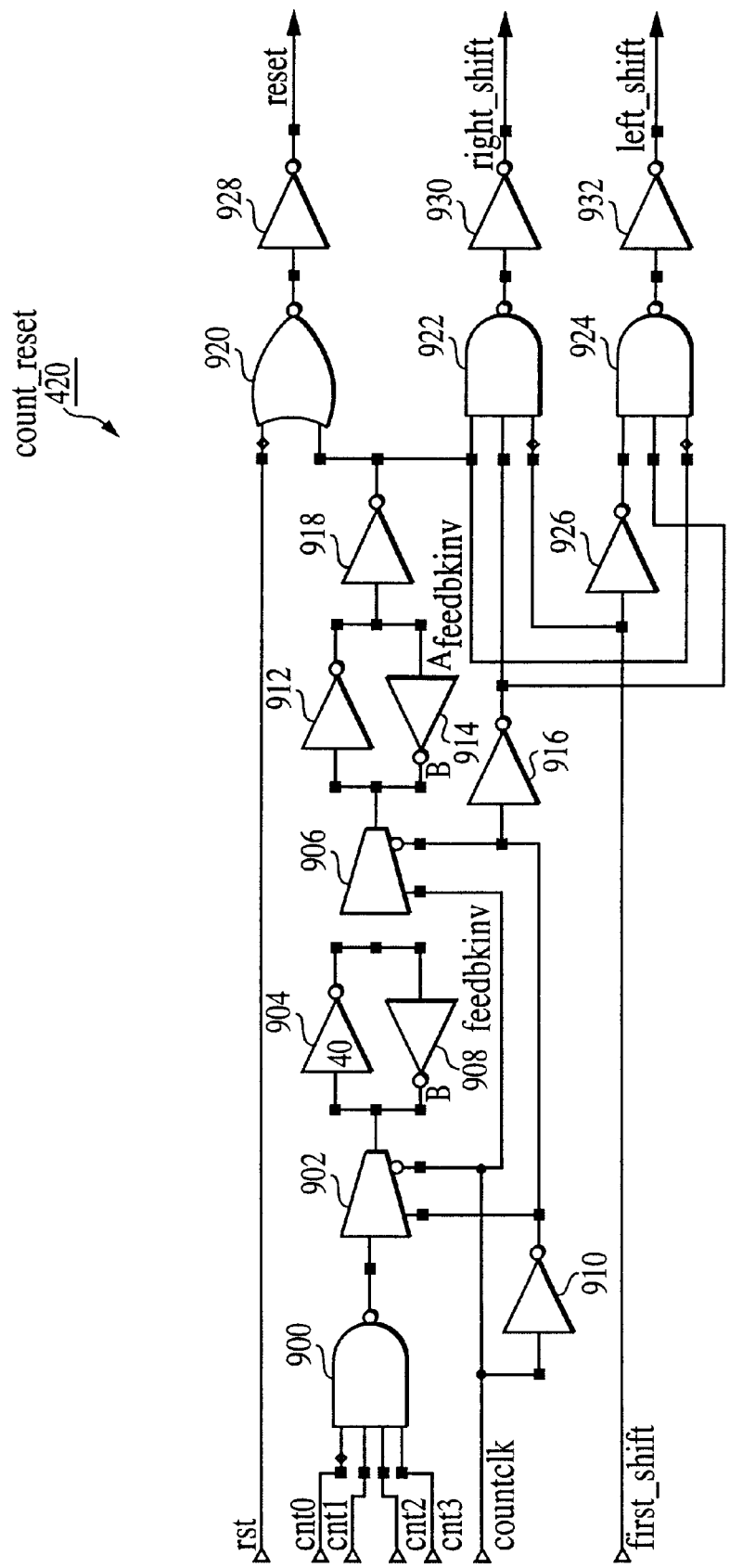
FIG. 9 depicts a schematic diagram of the "count_reset" circuit of FIG. 4, in accordance with an exemplary embodiment of the invention.

Turning to FIG. 9, a schematic diagram of the "count_reset" circuit 420 is depicted. A reset signal rst is input to NOR gate 920. The output of NOR gate 920 is fed into an input of inverter 928. The output of the counter cnt 0–cnt 3 is input to NOR gate 900. The output of NAND gate 900 is fed into an input of transmission gate 902. The output of a transmission gate 902 is fed into an input of inverter 904 and the output of inverter 904 is fed into an input of transmission gate 906. The output of transmission gate 906 is fed into an input of inverter 912 and the output of inverter 912 is fed into an input of inverter 918. The output of inverter 918 is an input to NOR gate 920. An output of inverter 904 is also coupled to an input of feedback inverter 908. The output of inverter 908 is a feedback signal to inverter 904. Inverters 904 and 908 function as a latch. The output of inverter 912 is fed into an input of feedback inverter 914 which produces a feedback signal to inverter 912. Inverters 912 and 914 function as a latch. The output of NOR gate 920 is fed into an input of inverter 928, the output of which is a reset signal, reset.

The countclk signal is input to inverter 910 and also to an enable input of multiplexers 902 and 906. The output of inverter 910 is coupled to an enable input of multiplexers 902 and 906, and also to an input of inverter 916. The output of inverter 916 is coupled to an input to NAND gate 922 and also to an input of NAND gate 924. Another input of NAND gate 922 comes from an output of inverter 918. The output of inverter 918 is also input to NOR gate 920. The output of inverter 918 is also coupled to an input of NAND gate 924. The output of NAND gate 924 is coupled to an input of inverter 932, the output of which becomes a left_shift signal. The output of NAND gate 922 is coupled to an input of inverter 930, the output of which becomes a right_shift signal. The left_shift signal and the right_shift signal are transmitted to the shift register 103 of the DDLL 302 (of FIG. 3) once the counter has reached binary 15 (1111). In addition, once the counter reaches 1111, the counter is reset to 0000 and waits for the first shift signal to be received which indicates whether an SR or an SL signal indicates a counter increment.

Turning to FIG. 10, a timing diagram showing the operation of the majority filter counter circuit 300 within the DDLL 302 circuit of FIG. 3 is depicted in greater detail. The first logic HIGH signal received is an SR signal. This means that the SR signal signifies an increment of the counter circuit 410 by one and each subsequent SL signal received decrements the counter circuit 410 by one. If the first logic HIGH signal received had been an SL signal, then every subsequent SL signal received would increment the counter and every subsequent SR signal would decrement the counter circuit 410. If the counter circuit 410 counts up to binary 15 (1111), sixteen SR signals have been received (i.e., the first_shift signal recorded and 15 subsequent SR signals). When the counter reaches 1111, then a right_shift signal is sent from the counter resetter ("count_reset") circuit 420 to the shift register 103, instructing the delay line(s) (either 101, 102 or both) to shift by one tap.

Still referring to FIG. 10, the counter counts the SR pulses until at point A an NS pulse occurs. This causes the increment signal (inc) to go logic LOW, indicating that the increment control is deactivated since a signal other than an SR has been received, thus, causing the counter to decrement by one. At time C, the counter circuit 410 has decremented to 0000 and a new first_shift signal is recorded as a shift left SL. Consequently, SL now becomes the counter's incrementor. At time B, an SR pulse causes a decrement for one clock cycle. At time D, the counter circuit 410 has again decremented all the way back to 0000 and an NS (no shift) pulse causes the counter to skip a clock. That is, it remains at 0000 until the next SR or SL occurs with the next SR or SL signal being the first_shift signal controlling counter increments. Here, SR is the new recorded first_shift signal. At time E, the counter circuit 410 has progressed all the way to 1111, which sends the shift register 103 the message that it is time to shift. The shift direction is recorded in the "first_shift" circuit 415. In this case, it is a right_shift signal. The counter then resets to 0000 and waits for an SR or SL first_shift signal indicating which one signifies an increment of the counter circuit 410 and the process is repeated as long as necessary.

Figure 11:
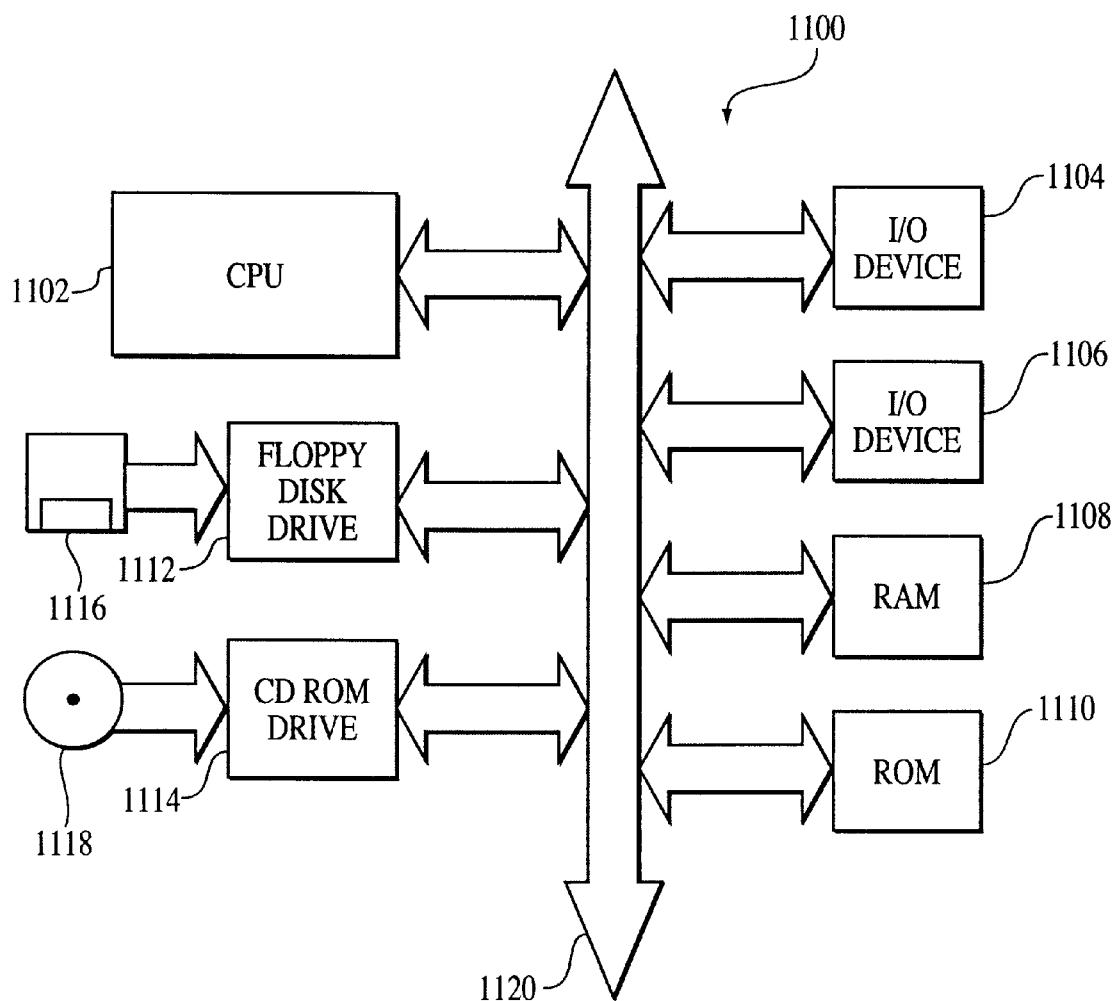
FIG. 11 depicts a block diagram of a processor-based system containing the DDLL circuit of FIG. 3 in accordance with an exemplary embodiment of the present invention.

FIG. 11 illustrates a block diagram of a processor system 1100 containing a semiconductor memory having a DDLL circuit 302 as described in connection with FIGS. 3–10. For example, the majority filter counter circuit 300 described in connection with FIGS. 3–10 may be part of dynamic random access memory (DRAM) 1108. The processor-based system 1100 may be a computer system or any other processor system. It should also be noted that the processor itself may have the DDLL circuit 302 as described in connection with FIGS. 3–10. The system 1100 includes a central processing unit (CPU) 1102, e.g., a microprocessor, that communicates with floppy disk drive 1112 and CD ROM drive 1114 over a bus 1120. It must be noted that the bus 1120 may be a series of buses and bridges commonly used in a processor-based system, but for convenience purposes only, the bus 1120 has been illustrated as a single bus. An input/output (I/O) device (e.g., monitor) 1104, 1106 may also be connected to the bus 1120, but are not required in order to practice the invention. The processor-based system 1100 also includes a read-only memory (ROM) 1100 which may also be used to store a software program.

Although the FIG. 11 block diagram depicts only one CPU 1102, the FIG. 11 system could also be configured as a parallel processor machine for performing parallel processing. As known in the art, parallel processor machines can be classified as single instruction/multiple data (SIMD), meaning all processors execute the same instructions at the same time, or multiple instruction/multiple data (MIMD), meaning each processor executes different instructions.

The present invention provides a majority filter counter circuit for use in a digital delay locked loop (DDLL) circuit 302. The improved DDLL circuit is used with a semiconductor memory. The buffer circuit of the improved DDLL contains a 4-bit counter circuit 410 for counting from binary 0000 to binary 1111 before a shift command is transmitted to the shift register 103 of the DDLL 302. The DDLL is thus capable of filtering out any unnecessary shifts that would otherwise be transmitted to the shift register 103 due to noise events by delaying the shift until at least 16 clock cycles indicate that a shift in the same direction (either SR or SL) is required. The invention accomplishes the above with only a 4-bit counter, thereby greatly reducing the required die space as compared with other proposed solutions. Furthermore, since the counter has the ability to, in effect, "bounce off of zero" by not allowing a decrement from 0000, only one counter is required. It should also be noted that since the increment signal generator circuit ("inc_gen") 405 generates the increment or decrement pulse directly from SL, SR or NS and does not feed the system clock directly into the counter, there are no timing glitches with respect to the clock. That is, SL, SR and NS can be pulses with different periods and duty cycles and the counter still counts without glitches.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuit configurations, it should be readily apparent that many different configurations can be used to achieve the same results described herein. In addition, although a 4-bit counter is described, any number of bits can be used for the counter and the counter can be configured to increment to any predetermined value before sending a shift command to the shift register. Accordingly, the invention is not limited by the foregoing description or drawings, but is only limited by the scope of the appended claims.

What is claimed as new and desired to be protected by Letters Patent of the United States is:

1. A filter counter circuit, comprising:
   a counter for counting to a predetermined number before causing a delay of an output signal of a delay locked loop circuit, wherein when a phase detector of said delay locked loop circuit transmits a first shift signal indicating a shift left, said counter increments for each subsequent shift left signal transmitted by said phase detector and decrements for each shift right signal transmitted by said phase detector, and wherein when said phase detector transmits a first shift signal indicating a shift right, said counter increments for each subsequent shift right signal transmitted by said phase detector and decrements for each shift left signal transmitted by said phase detector.

2. The circuit of claim 1, wherein said counter comprises an N-bit counter.

3. The circuit of claim 2, wherein said counter comprises a 4-bit counter.

4. The circuit of claim 3, wherein said 4-bit counter comprises four flip-flop circuits.

5. The circuit of claim 1 further comprising:
   an increment signal generator coupled to an input of said counter for generating an increment signal instructing said counter to increment and to decrement in response to said phase detector transmitting said shift right and shift left signals, depending upon which of said shift right and shift left signals is said first shift signal.

6. The circuit of claim 5 further comprising:
   a shift signal generator, an input of which is coupled to an output of said phase detector and an output of which is coupled to an input of said increment signal generator, said shift signal generator configured to generate a shift right (SR) signal when said phase detector transmits a shift right signal, said shift signal generator also being configured to generate a shift left (SL) signal when said phase detector transmits a shift left signal, wherein when said SR signal causes said increment signal generator to generate an increment signal, said SL signal causes said increment signal generator to generate a decrement signal, and vice versa.

7. The circuit of claim 6, wherein said shift signal generator is configured to generate a no shift (NS) signal when said phase detector transmits neither a shift right signal nor a shift left signal, said NS signal causing said increment signal generator to generate a decrement signal.

8. The circuit of claim 6 further comprising:
   a first shift recorder, at least a first input of which is coupled to an output of said counter for receiving said predetermined number, at least a second input of which is coupled to an output of said shift signal generator for receiving said SR and SL signals, said first shift recorder recording whether a first shift signal received from said shift signal generator is a SR or a SL, wherein whichever signal is received first, each subsequent receipt of said first received signal causes an increment of said counter.

9. The circuit of claim 8 further comprising:
   a counter resetter, at least a first input of which is coupled to said counter for receiving said predetermined number, at least a second input of which is coupled to said first shift recorder for receiving said recorded first shift signal, at least a first output of said counter resetter being coupled to a shift register of said delay locked loop circuit, said counter resetter resets said counter upon said counter reaching said predetermined number, said counter resetter also respectively transmits a right-shift pulse and a left-shift pulse to said shift register when said recorded first shift signal is a SR and a SL signal.

10. A filter counter circuit, comprising:

a counter for counting to a predetermined number before causing an adjustment in a delay of an output signal of a delay locked loop circuit, wherein when a phase detector of said delay locked loop transmits a first shift signal indicating a shift left, said counter counts in a first direction toward said predetermined number for each subsequent shift left signal transmitted by said phase detector and counts in a second direction away from said predetermined number for each shift right signal transmitted by said phase detector, and wherein when said phase detector transmits a first shift signal indicating a shift right, said counter counts in said first predetermined direction for each subsequent shift right signal transmitted by said phase detector and counts in said second predetermined direction for each shift left signal transmitted by said phase detector.

11. The circuit of claim 10, wherein said counter comprises an N-bit counter.

12. The circuit of claim 11, wherein said counter comprises a 4-bit counter.

13. The circuit of claim 12, wherein said 4-bit counter comprises four flip-flop circuits.

14. The circuit of claim 10 further comprising:

an increment signal generator coupled to an input of said counter for generating an increment signal instructing said counter to increment and to decrement in response to said phase detector transmitting said shift right and shift left signals, depending upon which of said shift right and shift left signals is said first shift signal.

15. The circuit of claim 14 further comprising:

a shift signal generator, an input of which is coupled to an output of said phase detector and an output of which is coupled to an input of said increment signal generator, said shift signal generator configured to generate a shift right (SR) signal when said phase detector transmits a shift right signal, said shift signal generator also being configured to generate a shift left (SL) signal when said phase detector transmits a shift left signal, wherein when said SR signal causes said increment signal generator to generate an increment signal, said SL signal causes said increment signal generator to generate a decrement signal, and vice versa.

16. The circuit of claim 15, wherein said shift signal generator is configured to generate a no shift (NS) signal when said phase detector transmits neither a shift right signal nor a shift left signal, said NS signal causing said increment signal generator to generate a signal to cause said counter to count in one of said first and second directions.

17. The circuit of claim 15 further comprising:

a first shift recorder, at least a first input of which is coupled to an output of said counter for receiving said predetermined number, at least a second input of which is coupled to an output of said shift signal generator for receiving said SR and SL signals, said first shift recorder recording whether a first shift signal received from said shift signal generator is a SR or a SL, wherein whichever signal is received first, each subsequent receipt of said first received signal causes said counter to count in one of a direction toward said predetermined number and a direction away from said predetermined number.

18. The circuit of claim 17 further comprising:

a counter resetter, at least a first input of which is coupled to said counter for receiving said predetermined number, at least a second input of which is coupled to said first shift recorder for receiving said recorded first shift signal, at least a first output of said counter resetter being coupled to a shift register of said delay locked loop circuit, said counter resetter resets said counter upon said counter reaching said predetermined number, said counter resetter also respectively transmits one of a right-shift pulse and a left-shift pulse to said shift register.

19. A delay locked loop circuit for a semiconductor memory, the delay locked loop circuit comprising:

a filter counter circuit, an input of which is coupled to an output of a phase detector, an output of which is coupled to a shift register which affects a delay of said delay locked loop circuit, said filter counter circuit comprising:

a counter for counting to a predetermined number before causing a delay of an output signal of said delay locked loop circuit, wherein when said phase detector transmits a first shift signal indicating a shift left, said counter increments for each subsequent shift left signal transmitted by said phase detector and decrements for each shift right signal transmitted by said phase detector, and wherein when said phase detector transmits a first shift signal indicating a shift right, said counter increments for each subsequent shift right signal transmitted by said phase detector and decrements for each shift left signal transmitted by said phase detector.

20. The delay locked loop circuit of claim 19, wherein said counter comprises an N-bit counter.

21. The delay locked loop circuit of claim 20, wherein said counter comprises a 4-bit counter.

22. The delay locked loop circuit of claim 21, wherein said 4-bit counter comprises four flip-flop circuits.

23. The delay locked loop circuit of claim 19, wherein said filter counter circuit further comprises:

an increment signal generator coupled to an input of said counter for generating an increment signal instructing said counter to increment and to decrement in response to said phase detector transmitting said shift right and shift left signals, depending upon which of said shift right and shift left signals is said first shift signal.

24. The delay locked loop circuit of claim 23, wherein said filter counter circuit further comprises:

a shift signal generator, an input of which is coupled to an output of said phase detector and an output of which is coupled to an input of said increment signal generator, said shift signal generator configured to generate a shift right (SR) signal when said phase detector transmits a shift right signal, said shift generator also being configured to generate a shift left (SL) signal when said phase detector transmits a shift left signal, wherein when said SR signal causes said increment signal generator to generate an increment signal, said SL signal causes said increment signal generator to generate a decrement signal, and vice versa.

25. The delay locked loop circuit of claim 24, wherein said filter counter circuit further comprises:

a first shift recorder, at least a first input of which is coupled to an output of said counter for receiving said predetermined number, at least a second input of which is coupled to an output of said shift signal generator for receiving said SR and SL signals, said first shift recorder recording whether a first shift received from said shift signal generator is a SR or a SL, wherein whichever signal is received first, each subsequent receipt of said first received signal causes an increment of said counter.

26. The delay locked loop circuit of claim 25, wherein said filter counter circuit further comprises:

a counter resetter, at least a first input of which is coupled to said counter for receiving said predetermined number, at least a second input of which is coupled to said first shift recorder for receiving said recorded first shift signal, at least a first output of said counter resetter being coupled to a shift register of said delay locked loop circuit, said counter resetter resets said counter upon said counter reaching said predetermined number, said counter resetter also respectively transmits a right-shift pulse and a left-shift pulse to said shift register when said recorded first shift signal is a SR and a SL signal.

27. A filter counter circuit for use with a delay locked loop circuit, the filter counter circuit comprising:

a counter for counting to a predetermined number before causing a delay of an output signal of a delay locked loop circuit, wherein when a phase detector of said delay locked loop circuit transmits a first shift signal indicating a shift left, said counter increments for each subsequent shift left signal transmitted by said phase detector and decrements for each shift right signal transmitted by said phase detector, and wherein when said phase detector transmits a first shift signal indicating a shift right, said counter increments for each subsequent shift right signal transmitted by said phase detector and decrements for each shift left signal transmitted by said phase detector;

an increment signal generator coupled to an input of said counter for generating an increment signal instructing said counter to increment and to decrement in response to said phase detector transmitting said shift right and shift left signals, depending upon which of said shift right and shift left signals is said first shift signal;

a shift signal generator, an input of which is coupled to an output of said phase detector and an output of which is coupled to an input of said increment signal generator, said shift signal generator configured to generate a shift right (SR) signal when said phase detector transmits a shift right signal, said shift generator also being configured to generate a shift left (SL) signal when said phase detector transmits a shift left signal, wherein when said SR signal causes said increment signal generator to generate an increment signal, said SL signal causes said increment signal generator to generate a decrement signal, and vice versa;

a first shift recorder, at least a first input of which is coupled to an output of said counter for receiving said predetermined number, at least a second input of which is coupled to an output of said shift signal generator for receiving said SR and SL signals, said first shift recorder recording whether a first shift received from said shift signal generator is a SR or a SL, wherein whichever signal is received first, each subsequent receipt of said first received signal causes an increment of said counter; and a counter resetter, at least a first input of which is coupled to said counter for receiving said predetermined number, at least a second input of which is coupled to said first shift recorder for receiving said recorded first shift signal, at least a first output of said counter resetter being coupled to a shift register of said delay locked loop circuit, said counter resetter resets said counter upon said counter reaching said predetermined number, said counter resetter also respectively transmits a right-shift pulse and a left-shift pulse to said shift register when said recorded first shift signal is a SR and a SL signal.

28. A delay locked loop circuit, comprising:

an adjustable delay line for receiving an applied signal and providing a delayed output signal;

a phase detector for comparing a signal representing said output signal with a reference signal representing said applied signal and providing shift left or shift right signals;

a counter circuit for counting from a first value to a second value, said counting circuit being responsive to an output of said phase detector and determining if a first output signal received from said phase detector after said counter is reset is a shift left or shift right signal, said counter circuit counting to said second value for each subsequently received shift left or shift right signal which is the same as said first received output signal and counting towards said first value for each subsequently received shift left or shift right signal which is not the same as said first received output signal, said counter providing a shift left or shift right output when said second count value is achieved and in accordance with whether said first received output signal was a shift left or shift right signal; and an adjustment circuit for adjusting said delay line with a shift right or shift left instruction in accordance with the shift left or shift right output of said counter circuit.

29. A method for delaying shifting of an output signal of a delay locked loop circuit, the method comprising:

incrementing a counter to a predetermined number, wherein when said counter is at an initial value, a phase detector of said delay locked loop circuit transmits a shift signal indicating a shift left, said counter increments for each subsequent shift left signal transmitted by said phase detector and decrements for each shift right signal transmitted by said phase detector, and wherein when said counter is at said initial value, said phase detector transmits a shift signal indicating a shift right, said counter increments for each subsequent shift right signal transmitted by said phase detector and decrements for each shift left signal transmitted by said phase detector; and when said counter has incremented to said predetermined number, shifting said output signal of said delay locked loop circuit by transmitting a left shift signal to a shift register of said delay locked loop circuit if said phase detector transmitted a signal indicating a shift left when said counter was at said initial value, and transmitting a right shift signal to said shift register if said phase detector transmitted a signal indicating a shift right when said counter was at said initial value.

30. The method of claim 29, wherein said act of incrementing comprises:

generating an increment signal instructing said counter to increment and to decrement; and transmitting said increment signal to said counter in response to said phase detector transmitting said shift right and shift left signals.

31. The method of claim 29 further comprising:
resetting said counter to said initial value; and
recording a new shift signal transmitted by said phase detector when said counter is at said initial value, said newly recorded shift signal being one of a shift left signal and a shift right signal, wherein each subsequent transmission by said phase detector of said newly recorded shift signal causes said counter to increment.

32. The method of claim 29, wherein said act of incrementing comprises incrementing said counter to binary fifteen (1111).

33. The method of claim 30 further comprising:
generating a no shift (NS) signal in response to said phase detector transmitting neither a shift right signal nor a shift left signal;
generating a decrement signal and transmitting said decrement signal to said counter; and
decrementing said counter in response to receiving said decrement signal.

34. A method for delaying shifting of an output of a delay locked loop circuit, the method comprising:
incrementing a counter to a predetermined number, wherein when said counter is at an initial value and a phase detector of said delay locked loop circuit transmits a shift signal indicating a shift left, said counter increments for each subsequent shift left signal transmitted by said phase detector and decrements for each shift right signal transmitted by said phase detector, and wherein when said counter is at said initial value and said phase detector transmits a shift signal indicating a shift right, said counter increments for each subsequent shift right signal transmitted by said phase detector and decrements for each shift left signal transmitted by said phase detector;
when said counter has incremented to said predetermined number, shifting said output signal of said delay locked loop circuit by transmitting a left shift signal to a shift register of said delay locked loop circuit if said phase detector transmitted a signal indicating a shift left when said counter was at said initial value, and transmitting a right shift signal to said shift register if said phase detector transmitted a signal indicating a shift right when said counter was at said initial value;
generating an increment signal instructing said counter to increment and to decrement;
transmitting said increment signal to said counter in response to said phase detector transmitting said shift right and shift left signals;
resetting said counter to said initial value;
recording a new shift signal transmitted by said phase detector when said counter is at said initial value, said newly recorded shift signal being one of a shift left signal and a shift right signal, wherein each subsequent transmission by said phase detector of said newly recorded shift signal causes said counter to increment;
generating a no shift (NS) signal in response to said phase detector transmitting neither a shift right signal nor a shift left signal;
generating a decrement signal and transmitting said decrement signal to said counter; and
decrementing said counter in response to receiving said decrement signal.

35. A method for delaying shifting of an output of a delay locked loop circuit, the method comprising:
comparing, with a phase detector, a signal representing an output signal of said delay locked loop circuit with a reference signal representing an applied signal and providing shift left or shift right signals;
counting, with a counter circuit, from a first value to a second value and determining if a first output signal received from said phase detector after said counter is reset is a shift left or shift right signal, said counter circuit counting to said second value for each subsequently received shift left or shift right signal which is the same as said first detected output signal and counting towards said first value for each subsequently received shift left or shift right signal which is not the same as said first detected output signal;
providing a shift left or shift right output from said counter when said second count value is achieved and in accordance with whether said first output signal was a shift left or shift right signal; and
adjusting said delay line with a shift right or shift left instruction in accordance with the output of said counter circuit.

36. A processor system comprising:
a processor;
a semiconductor memory circuit coupled to said processor, at least one of said semiconductor memory circuit and said processor having a filter counter circuit for use with a delay locked loop circuit, the filter counter circuit comprising:
a counter for counting to a predetermined number before causing a delay of an output signal of said delay locked loop circuit, wherein when a phase detector of said delay locked loop circuit transmits a first shift signal indicating a shift left, said counter increments for each subsequent shift left signal transmitted by said phase detector and decrements for each shift right signal transmitted by said phase detector, and wherein when said phase detector transmits a first shift signal indicating a shift right, said counter increments for each subsequent shift right signal transmitted by said phase detector and decrements for each shift left signal transmitted by said phase detector.

37. The system of claim 36, wherein said counter comprises an N-bit counter.

38. The system of claim 37, wherein said counter comprises a 4-bit counter.

39. The system of claim 38, wherein said 4-bit counter comprises four flip-flop circuits.

40. The system of claim 36 further comprising:
an increment signal generator coupled to an input of said counter for generating an increment signal instructing said counter to increment and to decrement in response to said phase detector transmitting said shift right and shift left signals, depending upon which of said shift right and shift left signals is said first shift signal.

41. The system of claim 40 further comprising:
a shift signal generator, an input of which is coupled to an output of said phase detector and an output of which is coupled to an input of said increment signal generator, said shift signal generator configured to generate a shift right (SR) signal when said phase detector transmits a shift right signal, said shift signal generator also being configured to generate a shift left (SL) signal when said phase detector transmits a shift left signal, wherein when said SR signal causes said increment signal generator to generate an increment signal, said SL signal causes said increment signal generator to generate a decrement signal, and vice versa.

42. The system of claim 41, wherein said shift signal generator is configured to generate a no shift (NS) signal when said phase detector transmits neither a shift right signal nor a shift left signal, said NS signal causing said increment signal generator to generate a decrement signal.

43. The system of claim 41 further comprising:
a first shift recorder, at least a first input of which is coupled to an output of said counter for receiving said predetermined number, at least a second input of which is coupled to an output of said shift signal generator for receiving said SR and SL signals, said first shift recorder recording whether a first shift signal received from said shift signal generator is a SR or a SL, wherein whichever signal is received first, each subsequent receipt of said first received signal causes an increment of said counter.

44. The system of claim 43 further comprising:
a counter resetter, at least a first input of which is coupled to said counter for receiving said predetermined number, at least a second input of which is coupled to said first shift recorder for receiving said recorded first shift signal, at least a first output of said counter resetter being coupled to a shift register of said delay locked loop circuit, said counter resetter resets said counter upon said counter reaching said predetermined number, said counter resetter also respectively transmits a right-shift pulse and a left-shift pulse to said shift register when said recorded first shift signal is a SR and a SL signal.

45. The system of claim 36, wherein said semiconductor memory circuit has said filter counter circuit.

46. A processor system, comprising:
a processor;
a semiconductor memory circuit coupled to said processor, at least one of said semiconductor memory circuit and said processor having a filter counter circuit for use with a delay locked loop circuit, the filter counter circuit comprising:
a counter for counting to a predetermined number before causing a delay of an output signal of said delay locked loop circuit, wherein when a phase detector of said delay locked loop circuit transmits a first shift signal indicating a shift left, said counter increments for each subsequent shift left signal transmitted by said phase detector and decrements for each shift right signal transmitted by said phase detector, and wherein when said phase detector transmits a first shift signal indicating a shift right, said counter increments for each subsequent shift right signal transmitted by said phase detector and decrements for each shift left signal transmitted by said phase detector;
an increment signal generator coupled to an input of said counter for generating an increment signal instructing said counter to increment and to decrement in response to said phase detector transmitting said shift right and shift left signals, depending upon which of said shift right and shift left signals is said first shift signal;
a shift signal generator, an input of which is coupled to an output of said phase detector and an output of which is coupled to an input of said increment signal generator, said shift signal generator configured to generate a shift right (SR) signal when said phase detector transmits a shift right signal, said shift signal generator also being configured to generate a shift left (SL) signal when said phase detector transmits a shift left signal, wherein when said SR signal causes said increment signal generator to generate an increment signal, said SL signal causes said increment signal generator to generate a decrement signal, and vice versa;
a first shift recorder, at least a first input of which is coupled to an output of said counter for receiving said predetermined number, at least a second input of which is coupled to an output of said shift signal generator for receiving said SR and SL signals, said first shift recorder recording whether a first shift signal received from said shift signal generator is a SR or a SL, wherein whichever signal is received first, each subsequent receipt of said first received signal causes an increment of said counter;
a counter resetter, at least a first input of which is coupled to said counter for receiving said predetermined number, at least a second input of which is coupled to said first shift recorder for receiving said recorded first shift signal, at least a first output of said counter resetter being coupled to a shift register of said delay locked loop circuit, said counter resetter resets said counter upon said counter reaching said predetermined number, said counter resetter also respectively transmits a right-shift pulse and a left-shift pulse to said shift register when said recorded first shift signal is a SR and a SL signal.

47. A processor system, comprising:
a processor;
a semiconductor memory circuit coupled to said processor, at least one of said semiconductor memory circuit and said processor having a delay locked loop circuit, the delay locked loop circuit comprising:
an adjustable delay line for receiving an applied signal and providing a delayed output signal;
a phase detector for comparing a signal representing said output signal with a reference signal representing said applied signal and providing shift left or shift right signals;
a counter circuit for counting from a first value to a second value, said counting circuit being responsive to an output of said phase detector and determining if a first output signal received from said phase detector after said counter is reset is a shift left or shift right signal, said counter circuit counting to said second value for each subsequently received shift left or shift right signal which is the same as said first received output signal and counting towards said first value for each subsequently received shift left or shift right signal which is not the same as said first received output signal, said counter providing a shift left or shift right output when said second count value is achieved and in accordance with whether said first received output signal was a shift left or shift right signal; and
an adjustment circuit for adjusting said delay line with a shift right or shift left instruction in accordance with the shift right or shift left output of said counter circuit.

48. A counter circuit comprising:
a counter for counting to a predetermined value and providing an output signal when said predetermined value is reached, said counter receiving at least two types of input signals, a first type of which causes said counter to count occurrences of said first type of input signal from a first preset value in a first direction toward said predetermined value when said first type of input signal is received first and a second type of which causes said counter to count occurrences of said second type of input signal in a second direction opposite the first direction.

49. A counter circuit as in claim 48 wherein said counter circuit receives a no count signal as an input signal and, in response, causes said counter to count occurrences of said no count signal in said second direction.

50. A counter as in claim 48 wherein said counter circuit further comprises a circuit for resetting said counter when said predetermined value is reached.

51. A counter as in claim 48 wherein said first type of input signal is one of a shift left and shift right signal and said second type of input signal is the other of said shift left and shift right signal.

* * * * *